(12) United States Patent
Ding et al.

(10) Patent No.: US 7,506,451 B1
(45) Date of Patent: Mar. 24, 2009

(54) CAMERA BASED TWO-POINT VISION ALIGNMENT FOR SEMICONDUCTOR DEVICE TESTING HANDLERS

(75) Inventors: Kexiang Ken Ding, San Diego, CA (US); Luis Muller, San Diego, CA (US); Stephen Aloysius Wetzel, San Diego, CA (US)

(73) Assignee: Delta Design, Inc., Poway, CA (US)

( * ) Notice: Subject to any disclaimer, the term of this patent is extended or adjusted under 35 U.S.C. 154(b) by 0 days.

(21) Appl. No.: 12/153,780

(22) Filed: May 23, 2008

(51) Int. Cl.
*G01D 21/00* (2006.01)
*B65G 65/02* (2006.01)

(52) U.S. Cl. .............................. 33/286; 33/645; 414/404
(58) Field of Classification Search ................ 33/286, 33/613, 644, 645, 533, 1 BB; 414/404
See application file for complete search history.

(56) References Cited

U.S. PATENT DOCUMENTS

| | | | | |
|---|---|---|---|---|
| 5,290,134 | A * | 3/1994 | Baba | 414/404 |
| 5,739,525 | A * | 4/1998 | Greve | 250/227.11 |
| 6,024,526 | A * | 2/2000 | Slocum et al. | 414/226.01 |
| 7,049,577 | B2 * | 5/2006 | Muller et al. | 250/221 |
| 2006/0038883 | A1 * | 2/2006 | Knoedgen et al. | 348/92 |
| 2006/0231778 | A1 * | 10/2006 | Kumar et al. | 250/559.4 |
| 2007/0185676 | A1 * | 8/2007 | Ding et al. | 702/94 |

* cited by examiner

*Primary Examiner*—Yaritza Guadalupe-McCall
(74) *Attorney, Agent, or Firm*—Foley & Lardner LLP

(57) ABSTRACT

A guiding plate based vision alignment system for a test handler includes cameras, configured to view the position difference between a tested device and the corresponding contactor. A pick-and-place handler is configured to move the device. A guiding plate is configured to actuate guiding plate with one translation alignment feature and one rotation alignment feature to correct the position offset between the tested device and the corresponding contactor.

10 Claims, 4 Drawing Sheets

Fig. 5

1000 — Imaging a training device in a device holder with two guide circular features using a device-view camera Recording the positions of the guiding features on the device holder in the training device coordinate 1020 — Moving the guiding plate to the contactor nominal position using three actuators Inserting the training device to the guiding plate with the guiding slots 1040 — Locking the training device to the guiding plate and release the device holder from the plate Imaging and recording the position of the guiding plate to the training device coordinate using a contactor-view camera Establishing the calibrated transform from the contactor nominal position to the device holder with the guiding plate and the three actuator nominal positions

Providing a tested device on a device holder under the device view camera

2010

Determining the position offset between the tested device and the two circular guiding features on the device holder Using the pre-calibrated transform to determine the offset between the device and contactor Converting the offset to the linear motions of three actuators to position the guiding plate Locking the guiding plate and inserting the device with device holder to the contactor through the guiding plate

CAMERA BASED TWO-POINT VISION ALIGNMENT FOR SEMICONDUCTOR DEVICE TESTING HANDLERS

BACKGROUND OF THE INVENTION

The present invention relates generally to the field of automated test handlers for semi-conductor devices. Specifically, the present invention relates to a vision alignment system for a semiconductor device test handler.

The following description of the background of the invention is provided simply as an aid in understanding the invention and is not admitted to describe or constitute prior art to the invention.

Semiconductor devices are subject to numerous tests before they are shipped to a wholesaler and/or end consumer. Manufacturers of semiconductor devices spend a significant amount of time testing devices prior to shipment. Therefore, it is desirable to speed up the semiconductor testing procedure by several methods.

Generally, a semiconductor device is tested using a testing handler. Testing handlers are configured to process and test a large amount of semiconductor devices. One aspect of semiconductor testing involves applying a testing contactor to the surface of a semiconductor device to carryout testing on the device. Aligning the semiconductor device with the testing contactor is an important step in the testing process for many reasons. First, proper alignment insures that the testing is carried out appropriately. In addition, the ability to quickly and automatically align a semiconductor device and a testing contactor allows for testing to proceed at an efficient rate.

Accordingly, there is a need for a system and method of efficiently and accurately aligning semiconductor devices with testing contactors.

SUMMARY OF THE INVENTION

According to one embodiment of the invention, a vision alignment system for a test handler includes several components. Cameras are configured to view the position difference between a tested device and the corresponding contactor. A pick-and-place handler is configured to move the tested device to the corresponding contactor. A guiding plate with one translation slot and one rotation slot to correct the position offset between the tested device and the corresponding contactor with the two alignment circle features on the device holder.

According to another embodiment of the invention, a device holder for holding and guiding the tested device to the corresponding contactor has two circular guiding features. The first guide feature determines the x and y position of the device holder. The second guiding feature determines the angle of the device holder. A method for calibrating a contactor begins by determining the contactor position in handler coordinate with a contactor-view camera in the guiding plate coordinate. The device holder position in guiding coordinate is determined by the two circular guiding features on the device holder and aligned by the two slots on the guiding plate. Next, the tested device position to the device holder circle features is determined by another device-view camera. Therefore, the offset between the tested device and the corresponding contactor is determined.

According to still another embodiment of the invention, a method for aligning a tested device in a test handler uses a guiding plate with two guiding slots and a device holder with two circle features to position the tested device.

It is to be understood that both the foregoing general description and the following detailed description are exemplary and explanatory only, and are not restrictive of the invention as claimed.

BRIEF DESCRIPTION OF THE DRAWINGS

FIG. 5 is a flowchart of the calibration process of the vision alignment system according to one embodiment.

FIG. 6 is a flowchart of the testing process of the vision alignment system according to one embodiment.

DETAILED DESCRIPTION OF THE PREFERRED EMBODIMENTS

Embodiments of the present invention will be described below with reference to the accompanying drawings. It should be understood that the following description is intended to describe exemplary embodiments of the invention, and not to limit the invention.

Figure 1:
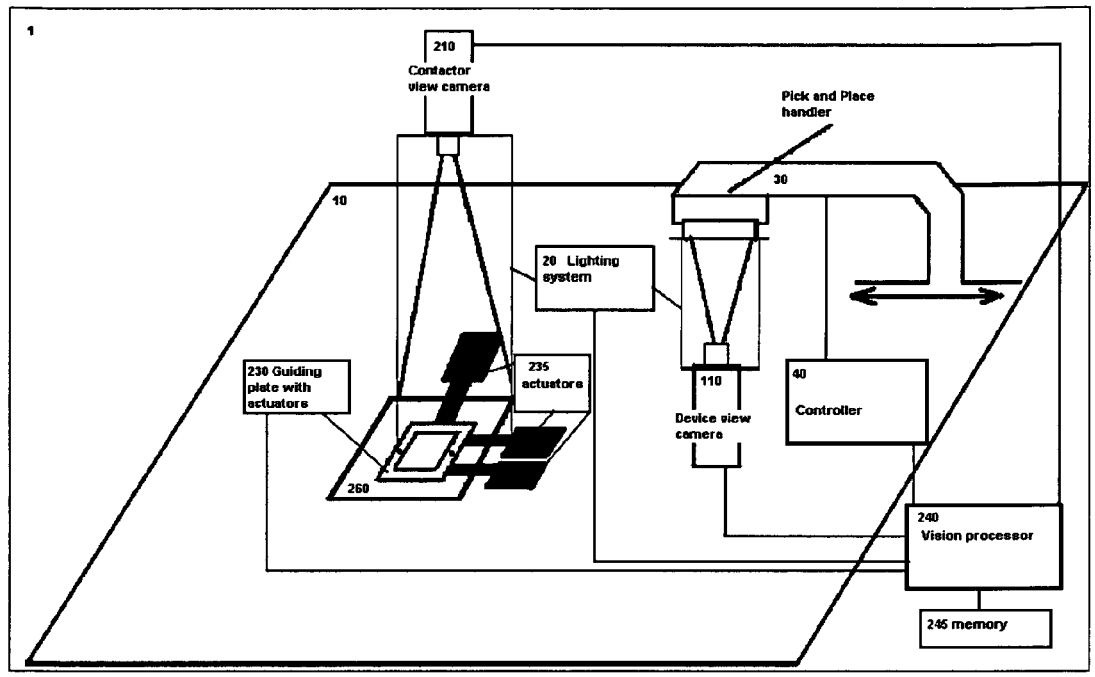
FIG. 1 is a block diagram of the vision alignment system according to one embodiment of the present invention.

FIG. 1 shows an alignment vision system 1 according to one embodiment of the invention. A test handler 10 for testing semiconductor devices has a handling side and an imaging side. The handling side of the test handler 10 includes a pick and place handler 30, a guiding plate 230 with three actuators 235 and a controller 40. The imaging side of the test handler 10 includes a contactor-view camera 210 and a device-view camera 110 with a lighting system 20. The imaging side of the test handler 10 includes a vision alignment processor 240, having a memory 245 is operatively connected to the device-view camera 110 and the contactor-view camera 210.

As shown in FIG. 1, the pick and place handler 30 spans across both the handling side and the imaging side of the test handler 10. The pick and place handler 30 positions a device holder 150 and/or a tested device "DUT" 250 (FIGS. 2 and 3) so that the contactor-view camera 210 or the device-view camera 110 can capture high contrast images of the subject devices.

The controller 40 is operatively connected to all the components in the test handler 10 and the vision alignment processor 240. Accordingly, the vision alignment controller 240 controls and coordinates all imaging related operations that take place in the test handler 10.

The lighting system 20 provides high contrast lighting for the contactor-view camera 210 and the device-view camera 110. According to one embodiment, the lighting system 20 is comprised of two separate lighting devices (one for the contactor-view camera 210 and one for the device-view camera 110), each controlling a three channel programmable LED array. In order to achieve high contrast, the lighting system 20 is configured to provide lighting in the range of zero (0°) to ninety (90°) degrees relative to the subject of the cameras 110, 210. The lighting system 20 comprises a lighting processor which is configured to execute trained vision recipes. These recipes are executed by the lighting system 20 in order to provide lighting according to user desired configurations.

The contactor-view camera 210 is configured to capture images for the purposes of determining the contactor position in the handler coordinate system. The contactor-view camera 210 may be a CCD or CMOS camera.

Similarly, the device-view camera 110 is configured to capture images of a DUT 250 and the device holder 150. The device-view camera 1100 may be a CCD or CMOS camera.

The images captured by the device-view camera 110 are analyzed by a vision alignment processor 240. The vision alignment processor 240 is configured to execute vision alignment software and transforms the images captured by the device-view camera 110 to determine whether the position of a DUT 250 needs adjustment so that it will mate accurately with a testing contactor 260. The vision alignment controller 240 is also configured to control a guiding plate 230 to effectively provide information to change the position of the DUT 250.

Operation of the vision alignment system 1 will now be described. The vision alignment system 1 operates in at least two modes. The vision alignment system 1 is configured to calibrate itself based on a given testing contactor 260 and device holder 150. In addition, the vision alignment system 1 is configured to align DUTs 250 with a testing contactor 260 for the purpose of carrying out testing.

Figure 2:
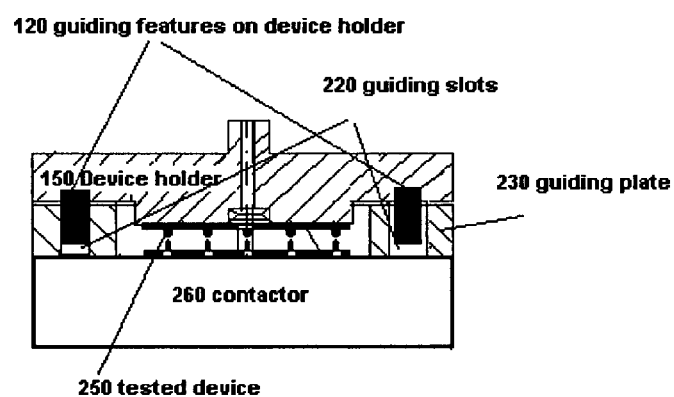
FIG. 2. is a diagram of a device in a device holder and guided by a guiding plate to a contactor.
Figure 3:
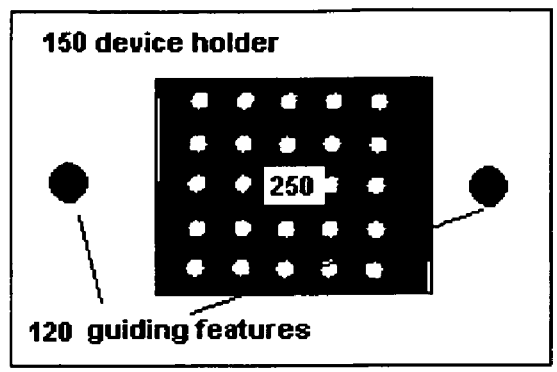
FIG. 3 is a diagram of a bottom view of a training IC device with a device holder.

The calibration operation of the vision alignment system 1 is as follows. First, as shown in FIG. 5, a double sided visible glass target with a high contrast dot array (a training device) in a device holder 150 with two alignment circle features (guiding features) is imaged by a device view camera 110 (Step 1000). The positions of the alignment circle features on the device holder 150 in the training device coordinate system are recorded (Step 1010). The guiding plate 230 is positioned to the contactor position using three actuators 235 (Step 1020). Next, two guiding features 120 (guiding circles) are inserted on to the guiding plate 230 (Step 1030). As shown in FIG. 2, guiding slots 220 receive the guiding features 120. The training device is locked the guiding plate 230 and the device holder 150 is released from the guiding plate 230 (Step 1040). The contactor-view camera 210 images and records the position of the guiding plate 230 in the training device coordinate system 21 (Step 1050). Accordingly, the calibrated transform from the contactor nominal position to the device holder with the guiding plate and the three actuator nominal positions is established, a guiding coordinate system is established and the vision alignment system is calibrated and ready to begin DUT 250 alignment to the corresponding contactor 260.

The vision alignment procedure executed by the vision alignment system 1 is described as follows. First, a guiding coordinate system and transforms must be obtained from the calibration process described above. A DUT 250 is positioned by the device holder 150 so that it is observed by the vision device-view camera 110 (Step 2000). The vision device-view camera 110 captures images of the position of the DUT 250 relative to the two circular guiding features 120 (Step 2010). Using the pre-calibrated transform the offset between the device and contactor is determined (Step 2020). The offset calculation is then converted to linear motion commands for the three actuators 235 in order to position the guiding plate 230 (Step 2030). Next, the guiding plate 230 is locked and the device 150 with device holder 250 is inserted on to the contactor 260 through the guiding plate 230 (Step 2040).

Figure 4:
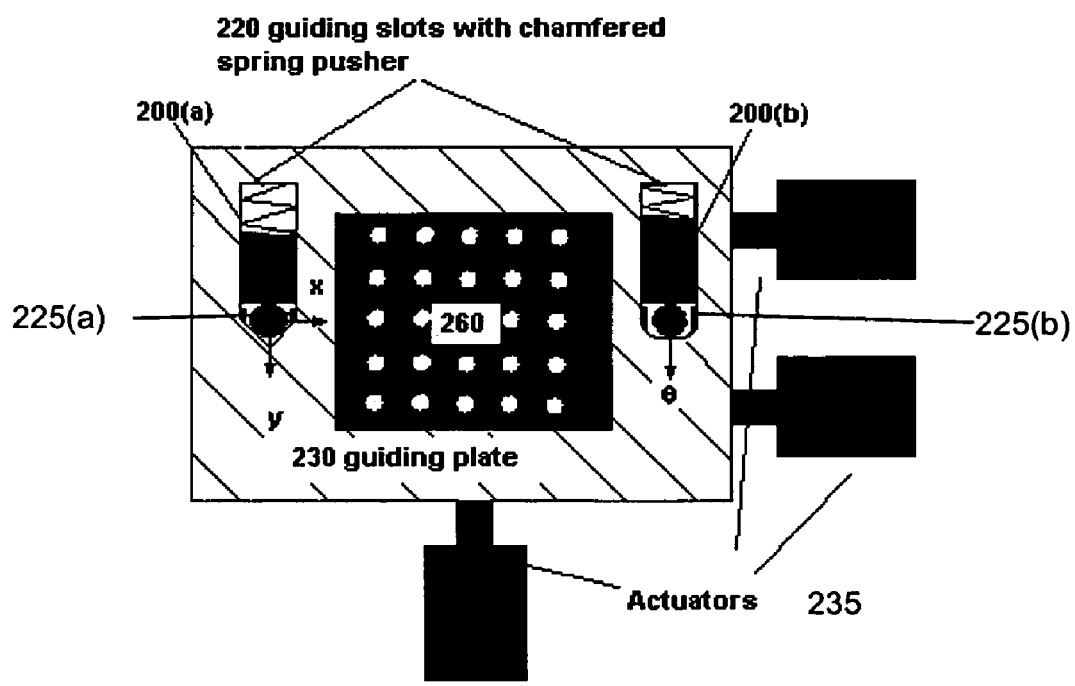
FIG. 4 is a diagram of a top section view of a guiding plate and a contactor with two guiding features on the device holder and two guiding slots on the guiding plate.

For example, FIG. 4 shows a DUT 250 having a difference in position relative to a device holder 150 and further to the corresponding contactor based on the previous calibration. As shown, the DUT 250 is positioned differently from the device holder 150 in the X and Y direction. In addition, the angular position of the DUT is different from that of the device holder 150. Accordingly, a guiding plate 230 acts upon the movable guiding slots 220 (via chamfered spring pushers 200(*a*) and 200(*b*)) to move the DUT 250 so that the position offset detected by the vision alignment processor 240 is eliminated (Step 2030). As a result, the DUT 250 is now aligned to accurately mate with a testing contactor 260.

According to one embodiment of the invention, the guiding plate 230 has two guiding slots 220. The first guide slot 220(*a*) is configured with two guiding surfaces (x,y) and a spring 200(*a*) to ensure touching between a guiding circle on the device holder and the guiding slot 220(*a*) on the guiding plate, the first (i.e., translational) guiding feature 225(*a*) moves the DUT 250 horizontally or vertically relative to the handler coordinate system. The second guide slot 220(*b*) is configured with one guiding surface (θ) and a spring 200(*b*) to ensure touching between a guiding circle on the device holder and the guiding slot 220(*b*) on the guiding plate, the second (i.e., rotational) guiding feature 225(*b*) adjusts the angular positioning of the DUT 250.

According to the embodiments of the invention described above, several advantages are realized. For example, the present invention simplifies the aligning process by using a pre-calibrated guiding plate instead of directly actuating on the device holder. As a result, the complexity involved with alignment procedures are greatly reduced which in turn reduces costs and increase the reliability. Moreover, the present invention can be applied across a large a number of device handlers, providing a scalable solution for testing firms.

The foregoing description of a preferred embodiment of the invention has been presented for purposes of illustration and description. It is not intended to be exhaustive or to limit the invention to the precise form disclosed, and modifications and variations are possible in light of the above teaching or may be acquired from practice of the invention. The embodiment was chosen and described in order to explain the principles of the invention and as a practical application to enable one skilled in the art to utilize the invention in various embodiments and with various modification are suited to the particular use contemplated. It is intended that the scope of the invention be defined by the claims appended hereto and their equivalents.

What is claimed is:

1. A vision alignment system for a test handler, comprising:
   a first camera, configured to view a position of a contactor in a handler coordinate system;
   a pick-and-place handler, configured to move a tested device to the contactor for testing;
   a second camera, configured to view a position of a device in a device holder coordinate system; two guiding features for correcting the position offset between the device and contactor; and
   a guiding plate, having three actuators, configured to actuate the guiding features on the device holder to correct the position offset between the tested device and the contactor.

2. A vision alignment system for a test handler as claimed in claim 1, wherein the device holder comprises:
   a first guiding feature configured to move the tested device horizontally or vertically; and
   a second guiding feature configured to adjust the angular position of the tested device.

3. A vision alignment system for a test handler as claimed in claim 1, wherein the guiding plate comprises:
   a first guide slot configured to adjust the tested device horizontally or vertically with two guiding surfaces and a spring to ensure touching between the guiding circle of the device holder and the guiding slot of the guiding plate;

a second guide slot configured to adjust the angular position of the tested device with one guiding surface and a spring to ensure touching between the guiding circle of the device holder and the guiding slot of the guiding plate; and a locking mechanism configured to lock the guiding plate to the contactor after the guiding plate actuated at the correct position.

4. A vision alignment system for a test handler as claimed in claim 1, wherein a double side visible training device with high contrast circle dot array is used as a training device to define a common coordinate viewed by the first camera and the second camera.

5. A vision alignment system for a test handler as claimed in claim 1, further comprising:

a controller for controlling the operation of the first camera, the second camera and the pick and place handler;

a lighting system configured to provide high contrast lighting for the first camera and the second camera; and a vision alignment processor, having a memory, configured to process images captured by the first and second processor in order to correct the position offset of the tested device.

6. A vision alignment system for a test handler as claimed in claim 5, wherein the lighting system is a three-channel programmable LED array.

7. A vision alignment system for a test handler as claimed in claim 5, wherein a lighting angle of the lighting system is in the range of zero to ninety degrees.

8. A vision alignment system as claimed in claim 5, wherein the vision alignment processor is configured to execute vision alignment software configured to operate the vision alignment system according to desired user settings.

9. A method for calibrating a vision alignment system for a test handler comprising the steps of:

imaging a training device in a device holder with two guide features using a first camera;

recording the positions of the guide features on the device holder in a training device coordinate system;

moving a guiding plate to a contactor nominal position using three actuators;

inserting the training device on to the guiding plate with guiding slots;

locking the training device to the guiding plate and releasing the device holder from the guiding plate;

imaging and recording the position of the guiding plate in reference to the training device coordinate using the second camera; and establishing a calibrated transform from the contactor nominal position to the device holder with the guiding plate and the three actuator nominal positions.

10. A method for aligning devices in a test handler, comprising the steps of:

providing a tested device on a device holder;

determining a position offset between the tested device and two guiding features on the device holder using a first camera;

using a pre-calibrated transform to determine the offset between the tested device and a contactor;

converting the offset to linear motion commands for three actuators to position a guiding plate; and locking the guiding plate and inserting the device with device holder to the contactor through the guiding plate.

* * * * *